(12) United States Patent
Lee et al.

(10) Patent No.: US 11,856,867 B2
(45) Date of Patent: Dec. 26, 2023

(54) MRAM HAVING MULTILAYERED INTERCONNECT STRUCTURES

(71) Applicant: UNITED MICROELECTRONICS CORP., Hsin-Chu (TW)

(72) Inventors: Kuo-Hsing Lee, Hsinchu County (TW); Chun-Hsien Lin, Tainan (TW); Sheng-Yuan Hsueh, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 429 days.

(21) Appl. No.: 17/095,752

(22) Filed: Nov. 12, 2020

(65) Prior Publication Data

US 2022/0123200 A1 Apr. 21, 2022

(30) Foreign Application Priority Data

Oct. 15, 2020 (CN) .......................... 202011102693.7

(51) Int. Cl.
*H10N 50/80* (2023.01)
*H10B 61/00* (2023.01)
*H10N 50/85* (2023.01)
*H10N 50/01* (2023.01)

(52) U.S. Cl.
CPC ............ *H10N 50/80* (2023.02); *H10B 61/20* (2023.02); *H10B 61/22* (2023.02); *H10N 50/01* (2023.02); *H10N 50/85* (2023.02)

(58) Field of Classification Search
CPC ........ H10N 50/01; H10N 50/80; H10N 50/85; H10B 61/20; H10B 61/22
See application file for complete search history.

(56) References Cited

U.S. PATENT DOCUMENTS

| | | | |
|---|---|---|---|
| 8,174,874 B2 | 5/2012 | Inaba | |
| 2014/0175583 A1* | 6/2014 | Doyle | H01L 29/82 257/427 |
| 2019/0206940 A1* | 7/2019 | Kim | H01L 29/41741 |
| 2019/0355788 A1 | 11/2019 | Chang et al. | |
| 2021/0217812 A1* | 7/2021 | Hsiao | H10B 61/00 |

* cited by examiner

*Primary Examiner* — Brigitte A Paterson
(74) *Attorney, Agent, or Firm* — Winston Hsu

(57) ABSTRACT

The present invention provides a semiconductor device and a method of forming the same, and the semiconductor device includes a substrate, a first interconnect layer and a second interconnect layer. The first interconnect layer is disposed on the substrate, and the first interconnect layer includes a first dielectric layer around a plurality of first magnetic tunneling junction (MTJ) structures. The second interconnect layer is disposed on the first interconnect layer, and the second interconnect layer includes a second dielectric layer around a plurality of second MTJ structures, wherein, the second MTJ structures and the first MTJ structures are alternately arranged along a direction. The semiconductor device may obtain a reduced size of each bit cell under a permissible process window, so as to improve the integration of components.

10 Claims, 11 Drawing Sheets

MRAM HAVING MULTILAYERED INTERCONNECT STRUCTURES

BACKGROUND OF THE INVENTION

1. Field of the Invention

The invention relates to a semiconductor device and a method of forming the same, and more particularly to a magnetoresistive random access memory (MRAM) device and a method of forming the same.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, and magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

One of the objectives of the present invention provides a semiconductor device, in which the dummy magnetic tunneling junctions (MTJs) in a staggered arrangement are disposed in different interconnect layers respectively, so as to shrink the cell height of each bit cell of the semiconductor device, for improving the element integration of the semiconductor device.

One of the objectives of the present invention provides a method of forming semiconductor device, in which a self-aligned merging process is performed to simultaneously define two interconnect layers disposed below the MTJs, thereby improving the sized bottleneck of the original fabricating process. Accordingly, the semiconductor device of the present invention may achieve advantages of shrinking the cell height of the bit cell and improving the element integration under the permissible process window.

To achieve the purpose described above, one embodiment of the present invention provides a semiconductor device including a substrate, a first interconnect layer and a second interconnect layer. The first interconnect layer is disposed on the substrate, and the first interconnect layer includes a first dielectric layer around a plurality of first magnetic tunneling junction (MTJ) structures. The second interconnect layer is disposed on the first interconnect layer, and the second interconnect layer includes a second dielectric layer around a plurality of second MTJ structures, wherein, the second MTJ structures and the first MTJ structures are alternately arranged along a direction.

To achieve the purpose described above, one embodiment of the present invention provides a method of forming semiconductor device, and the method including the following steps. Firstly, a substrate is provided, and a first interconnect layer is formed on the substrate, wherein the first interconnect layer includes a first dielectric layer around a plurality of first metal interconnections. Next, a second interconnect layer is formed on the first interconnect layer, wherein the second interconnect layer includes a second dielectric layer around a plurality of second metal interconnections and a plurality of third metal interconnections. The forming of the second metal interconnections and the third metal interconnections further includes forming a plurality of first mask patterns on the second dielectric layer, with the first mask patterns arranged in a first pitch, forming a plurality of second mask patterns on the first mask patterns, with the second mask patterns arranged in a second pitch which is greater than the first pitch, performing an etching process through the second mask patterns and the first mask patterns to form a plurality of first openings throughout the second dielectric layer and a plurality of second openings disposed within the second dielectric layer, and forming the second metal interconnections and the third metal interconnections in the first openings and the second openings. Then, a third interconnect layer is formed on the second interconnect layer, wherein the third interconnect layer includes a third dielectric layer around a plurality of first magnetic tunneling junction (MTJ) structures.

Overall speaking, the fabricating method of the semiconductor device in the present invention integrates the fabrication of two interconnect layers (for example including the first level via conductor layer and the second level metal interconnect layer), to simultaneously form the metal interconnections of the first level via conductor layer and the second level metal interconnect layer through a self-aligned merging process instead of a photolithographic process. Thus, the photolithographic process is avoided in used to form the mask patterns with the critical dimension, so that, the problem of constrictive process window caused by reducing the cell height of the bit cell may be improved thereby. Furthermore, the magnetic memory structures of the semiconductor device are alternately disposed within two different interconnect layers, so that, the minimized width and/or the minimized space of the magnetic memory structures, as well as the metal interconnections which are also disposed within the two interconnect layers, may be correspondingly enlarged. In this way, the semiconductor device of the present invention may sufficiently reduce the cell height of the bit cell of the semiconductor device under the permissible process window, thereby improving the element integration and maintaining the performance of the whole device.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 5-8 are schematic diagrams illustrating a fabricating method of a semiconductor device according to the second preferred embodiment of the present invention, in which:

FIG. 5 shows a cross-sectional view of a semiconductor device after forming first mask patterns;

FIG. 6 shows a cross-sectional view of a semiconductor device after forming second mask patterns;

FIG. 7 shows a cross-sectional view of a semiconductor device after performing an etching process; and FIG. 8 shows a cross-sectional view of a semiconductor device after forming a conductor.

FIGS. 11-13 are schematic diagrams illustrating a fabricating method of a semiconductor device according to the third preferred embodiment of the present invention, in which:

FIG. 11 shows a cross-sectional view of a semiconductor device after forming mask patterns;

FIG. 12 shows a cross-sectional view of a semiconductor device after performing an etching process; and FIG. 13 shows a cross-sectional view of a semiconductor device after forming a conductor.

DETAILED DESCRIPTION

To provide a better understanding of the presented invention, preferred embodiments will be described in detail. The preferred embodiments of the present invention are illustrated in the accompanying drawings with numbered elements.

Figure 1:
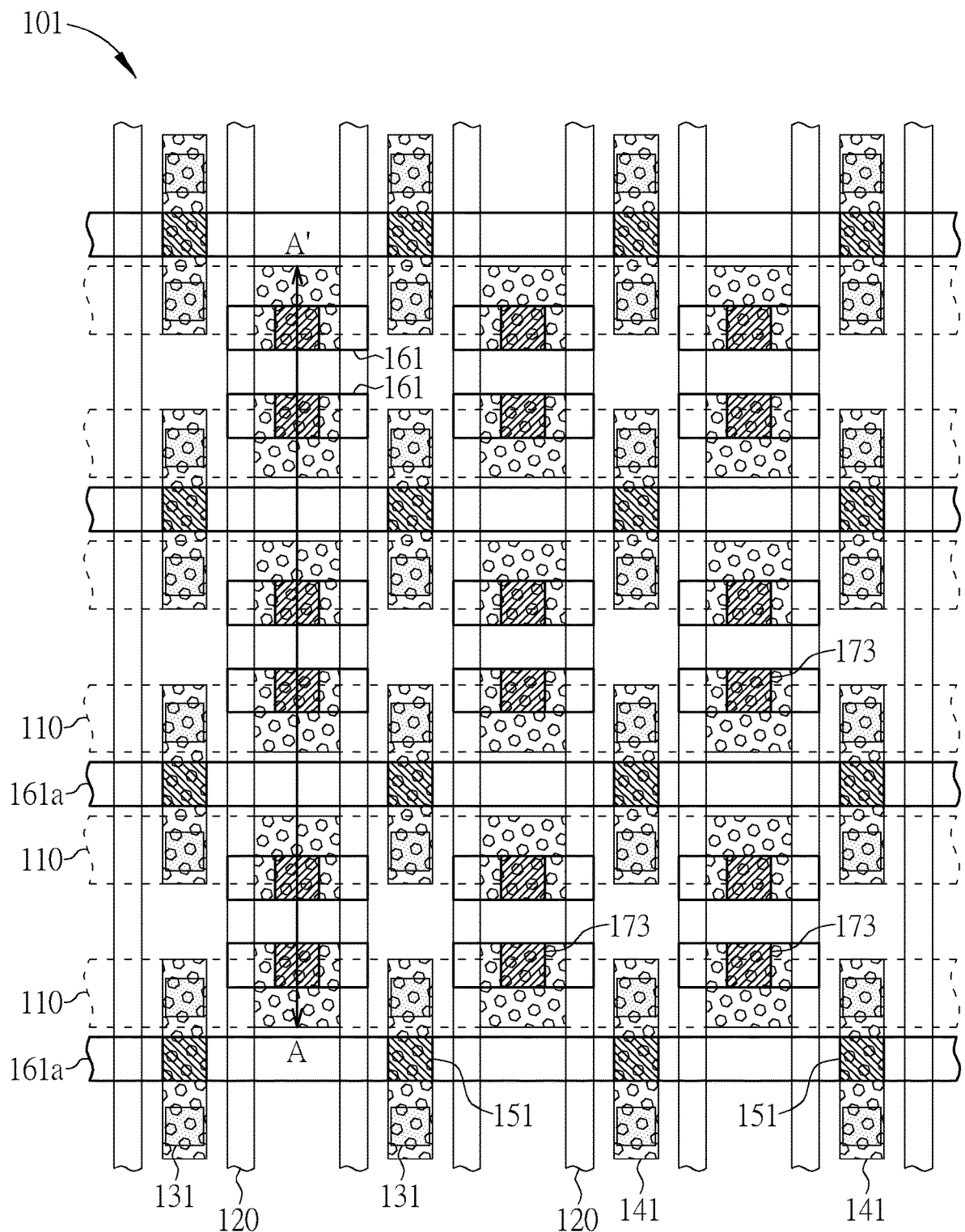
FIG. 1 is a schematic diagram illustrating a top view of a layout of a semiconductor device according to a first preferred embodiment of the present invention.
Figure 2:
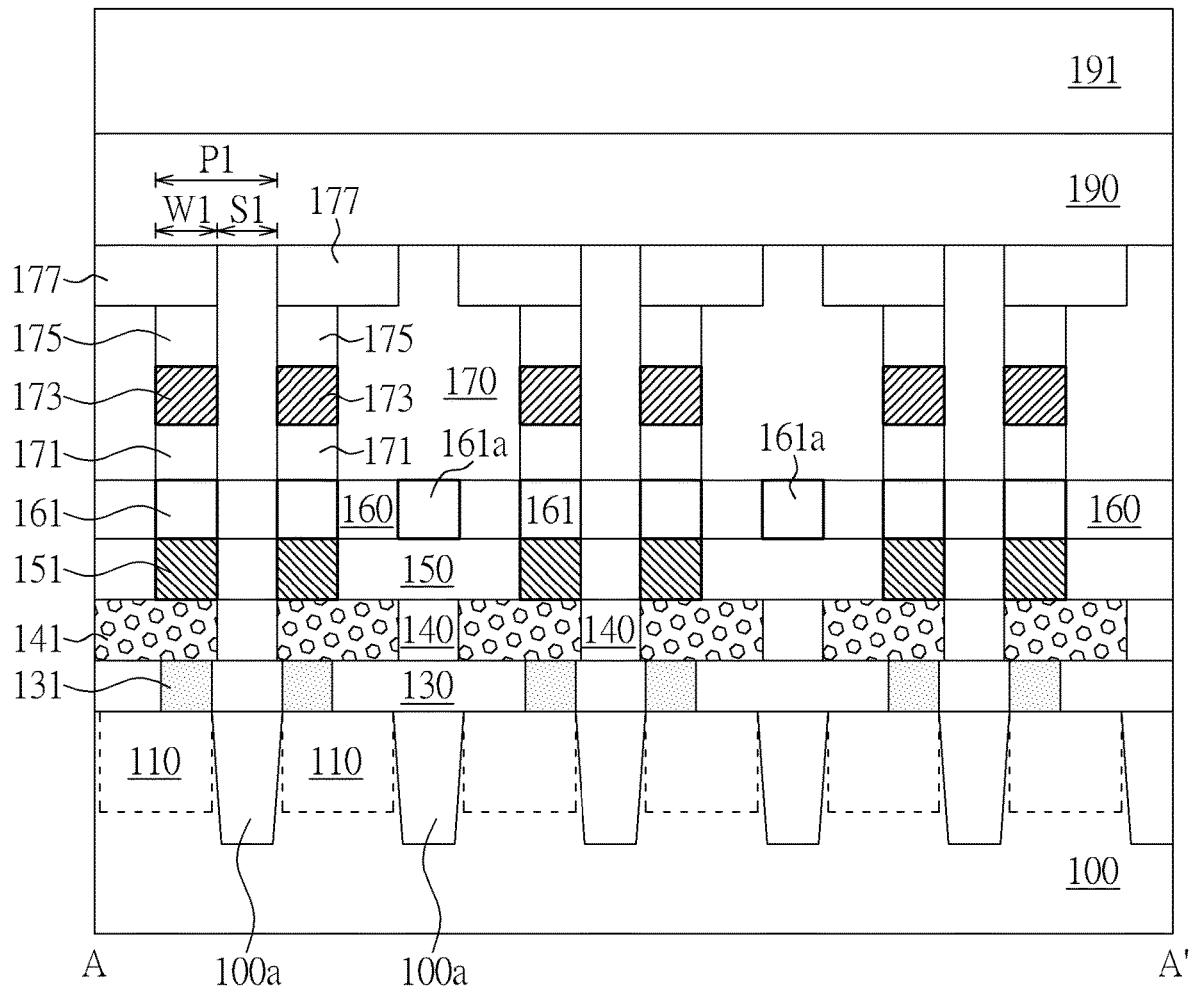
FIG. 2 is a schematic diagram illustrating a cross-sectional view taken along a cross line A-A' of FIG. 1.

Please refer to FIGS. 1-2, which illustrate a semiconductor device according to the first embodiment of the present invention, wherein FIG. 1 shows a top view of a layout of the semiconductor device and FIG. 2 shows a cross-sectional view of the semiconductor device. The semiconductor device is for example a magnetoresistive random access memory (MRAM) device, and which includes a substrate 100, such as a substrate made of semiconductor material, with the semiconductor material being selected from the group consisting of silicon (Si), germanium (Ge), Si—Ge compounds, silicon carbide (SiC), and gallium arsenide (GaAs). The substrate 100 preferably includes a MRAM region 101 and a logic region (not shown in the drawings) defined thereon. The MRAM region 101 of the substrate 100 further includes a plurality of doped regions (DF) 110, with each of the doped regions 110 being extended along the same direction (such as the x-direction) and spaced from each other by a plurality of shallow trench isolations 100a, as shown in FIG. 2.

The MRAM region 101 of the substrate 100 further includes a plurality of metal-oxide semiconductor (MOS) transistors disposed therein, and the MOS transistors may be planar MOS transistors or non-planar (such as FinFETs) MOS transistors. More specifically, the MOS transistors are formed by a plurality of gate structures 120 (for example metal gates) extended along another direction (such as the y-direction) and across the doped regions 110, and the portion of the doped regions 110 disposed at two sides of the gate structures 120 may be configured as source region/drain region (not shown in the drawings) of each MOS transistors. Since the fabrication of planar or non-planar transistors is well known to those skilled in the art, the details of which are not explained herein for the sake of brevity.

Then, an interlayer dielectric layer 130 is disposed on the substrate 100 to cover the MOS transistors, and a plurality of plugs 131 is disposed in the dielectric layer 130 to electrically connect to the source/drain regions of the MOS transistors. A plurality of interconnect layers is disposed on the interlayer dielectric layer 130, in which, a plurality of metal interconnections 141 is disposed over the interlayer dielectric layer 130 to electrically connect each of the plugs 131, and an inter-metal dielectric layer 140 surrounds the metal interconnections 141. Next, a plurality of metal interconnections 151 is disposed over the inter-metal dielectric layer 140 to electrically connect each of the metal interconnections 141, and an inter-metal dielectric layer 150 surrounds the metal interconnections 151, a plurality of metal interconnections 161, 161a is disposed over the inter-metal dielectric layer 150 to electrically connect each of the metal interconnections 151, and an inter-metal dielectric layer 160 surrounds the metal interconnections 161, 161a. It is noted that, the metal interconnections 161a are configured as a source line (SL), and which may be electrically connected to the source regions of the MOS transistors through the metal interconnections 141 and the plugs 131. For example, each of the metal interconnections 141, 161, 161a preferably includes a trench conductor, with the metal interconnections 141 to be referred as the first level metal interconnect layer (M1), and with the metal interconnections 161, 161a to be referred as the second level metal interconnect layer (M2), and each of the metal interconnections 151 preferably includes a via conductor, to be referred as the first level via conductor layer (V1).

Next, a plurality of metal interconnections 171, a plurality of magnetic memory structures 173, a plurality of metal interconnections 175 and a plurality of metal interconnections 177 are respectively disposed on the inter-metal dielectric layer 160 to electrically connect each of the metal interconnections 161, and at least one inter-metal dielectric layer 170 surrounds the metal interconnections 171, the magnetic memory structures 173, the metal interconnections 175 and the metal interconnections 177. Then, a word line (WL) 191 is disposed in an inter-metal dielectric layer 190, over the inter-metal dielectric layer 170, wherein, the word line 191 is not electrically connected to the metal interconnections 177 disposed underneath, and which is electrically connected to the gate structures 120 of the MOS transistors through an additional interconnect layer (not shown in the drawings). For example, each of the metal interconnections 171, 175 preferably includes a via conductor, to be referred as the second level via conductor layer (V2) and the third level via conductor layer (V3) respectively, and each of the metal interconnections 177 preferably includes a trench conductor, to be referred as the fourth level metal interconnect layer (M4). The magnetic memory structures 173 for example include magnetic tunnel junction (MTJ) structures, and the aforementioned interconnect layers may be sequentially disposed between the drain regions (namely the doped regions 110) of the MOS transistors and the magnetic memory structures 173, for electrically connecting the drain regions and the magnetic memory structures 173. It order to clearly distinguish the specific layout pattern, not all of the interconnect layers are shown in FIG. 1, in which, only the first level metal interconnect layer (for example including the metal interconnections 141), the first level via conductor layer (for example including the metal interconnections 151), the second level metal interconnect layer (for example including the metal interconnections 161) and the magnetic memory structures 173 are illustrated, the interconnect layers which are located at the lower layer and overlapped with the aforementioned metal interconnections are omitted, such as the interconnect layers disposed directly below the magnetic memory structures 173.

In some embodiment, each of the magnetic memory structures 173 preferably includes a bottom electrode (not shown in the drawings), a fixed layer (not shown in the drawings), a barrier layer (not shown in the drawings), a free layer (not shown in the drawings) and a top electrode (not shown in the drawings) stacked from bottom to top. The bottom electrode and top electrode preferably include a conductive material including but not limited to for example tantalum (Ta), platinum (Pt), copper (Cu), gold (Au), aluminum (Al), or a combination thereof. The fixed layer may include an antiferromagnetic (AFM) material including but not limited to for example ferromanganese (FeMn), platinum manganese (PtMn), iridium manganese (IrMn), nickel oxide (NiO), or a combination thereof, in which the fixed layer is formed to fix or limit the direction of magnetic moment of adjacent layers. The barrier layer may include an insulating material including but not limited to for example oxides such as aluminum oxide ($AlO_x$) or magnesium oxide (MgO). The free layer may include a ferromagnetic material including but not limited to for example iron, cobalt, nickel, or alloys thereof such as cobalt-iron-boron (CoFeB).

It is noted that, the source line (for example the metal interconnections 161a) of the semiconductor device in the present embodiment is disposed in the second level metal interconnect layer, so that, the width W1 of each of the metal interconnections 161, 161a and the space S1 therebetween are relatively constrictive, for example with the width W1/space S1 being about 50 nanometer (nm)/50 nm, and with the pitch P1 of the metal interconnections 161 being about 100 nm. With these arrangements, the minimized width and the minimized space of the interconnect layers (for example including the metal interconnects 151, 171, 175 and the magnetic memory structures 173) disposed above and below the second level metal interconnect layer may be affected by the width/space of the metal interconnections 161, and which are also requested to meet the requirement that both of the width and the space being about 50 nm, as shown in FIG. 2. People in the arts should fully understand that the aforementioned units and the numbers of width, space or pitch are all for example, which may be further modified according to the evolution of semiconductor manufacturing process, but not limited thereto.

In the semiconductor device of the present embodiment, a two-transistor one-resistor (2T1R) is used as a bit cell to increase the driving current thereof, and the cell width and the cell height of each of the bit cell are limited at a certain value, so that the semiconductor device may achieve a certain integration. Also, in the semiconductor device, the source line is disposed in the second level metal interconnect layer, so that the minimized width/the minimized space of the metal interconnections 161, the metal interconnections 151, 171, 175 and the magnetic memory structures 173 are all about 50 nm/50 nm, so as to reduce the cell height of the bit cell in the semiconductor device and to further improve the device integration.

People well known in the arts should easily realize the semiconductor device in the present invention is not limited to the aforementioned embodiment, and may further include other examples or variety in order to meet the practical requirements. For example, although the semiconductor device of aforementioned embodiment may obtain a reduced cell height of the bit cell, the process window of the current fabricating process fails to form each interconnect layer (for example including the metal interconnections 151, 171, 175 and the magnetic memory structures 173) with the minimized width/space about 50 nm/50 nm, thereby leading to the poor performance of the whole device. Thus, according to another embodiment, another semiconductor device and the fabricating method of forming the same are provided, in which, the semiconductor device may obtain a reduced cell height of the bit cell under a permissible process window, thereby improving the element integration. The following description will detail the different embodiments of the semiconductor device in the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 3:
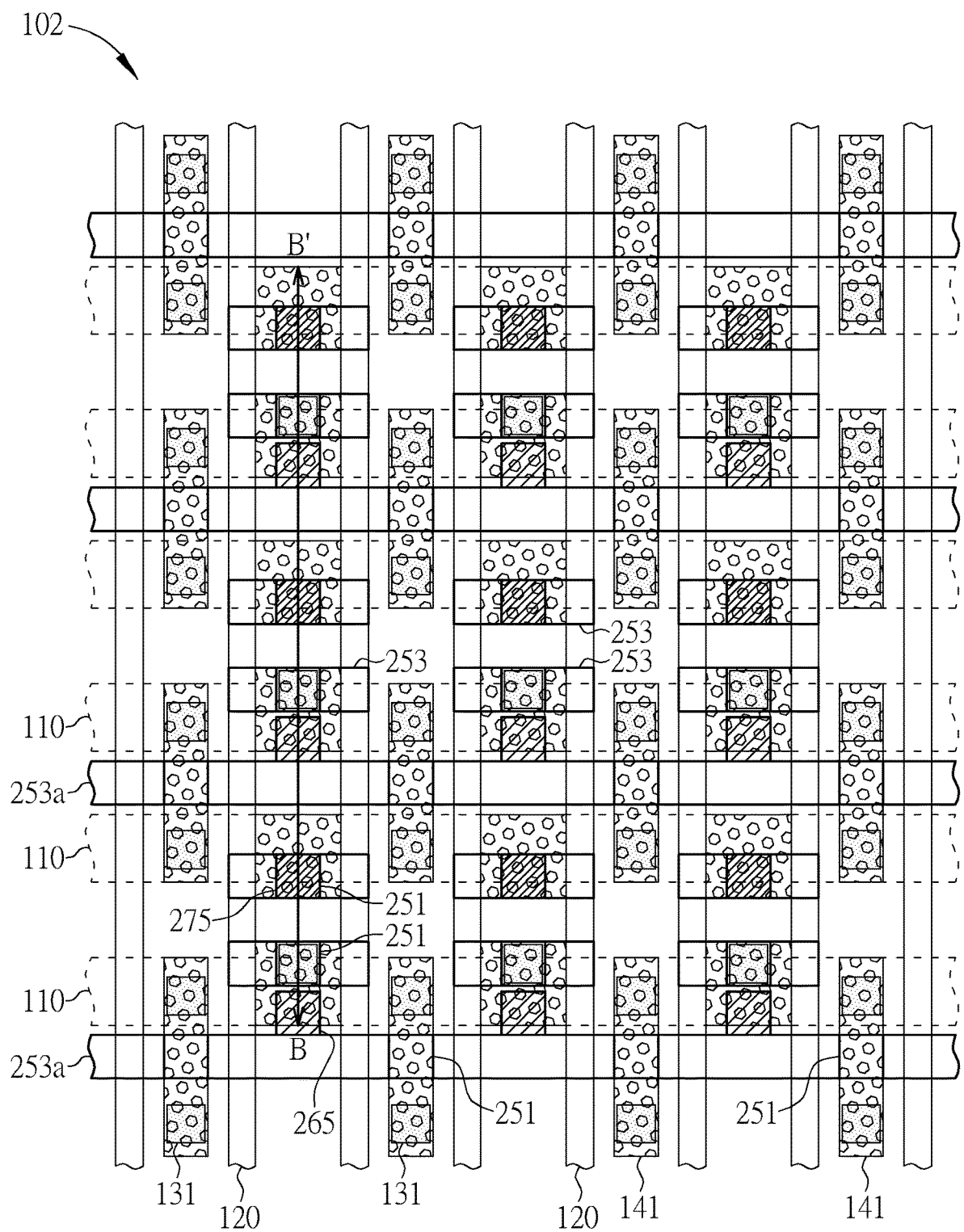
FIG. 3 is a schematic diagram illustrating a top view of a layout of a semiconductor device according to a second preferred embodiment of the present invention.
Figure 4:
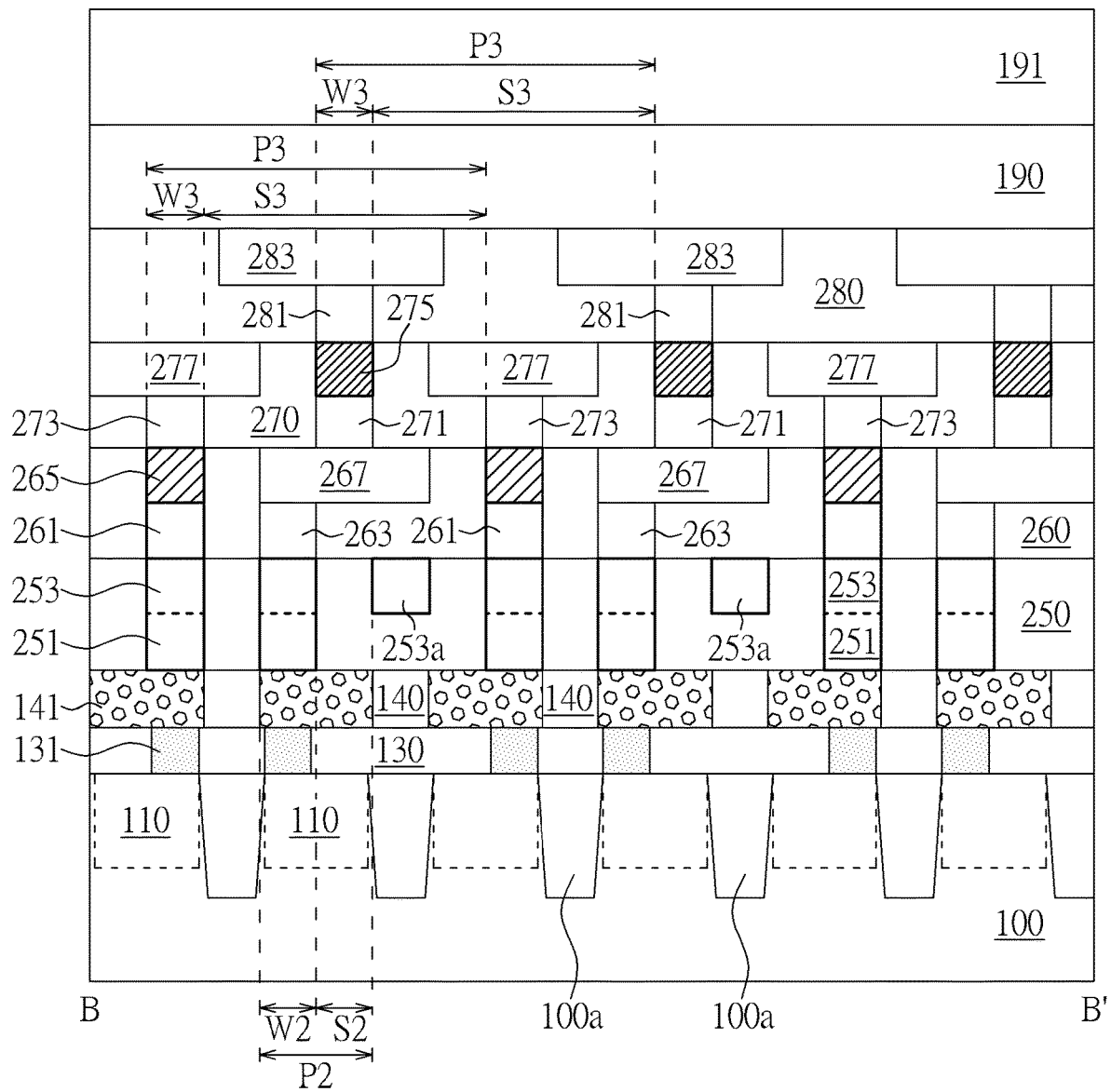
FIG. 4 is a schematic diagram illustrating a cross-sectional view taken along a cross line B-B' of FIG. 3.

Please refer to FIG. 3 to FIG. 8, which illustrate a semiconductor device according to the second embodiment of the present invention, wherein FIG. 3 shows a top view of a layout of the semiconductor device, FIG. 4 shows a cross-sectional view of the semiconductor device, and FIGS. 5-8 are schematic diagrams showing the fabricating processes of the semiconductor device, respectively. The semiconductor device is for example a MRAM device, and which also includes the substrate 100, the doped regions 110, the shallow trench isolations 100a, the gate structures 120, the plugs 131 disposed within the interlayer dielectric layer 130, the first level metal interconnect layer (for example including the metal interconnections 141 disposed within the inter-metal dielectric layer 140) and the word line 191 disposed within the inter-metal dielectric layer 190. The substrate 100 also includes a MRAM region 102 and the logic region, and all similarities between the aforementioned embodiment and the present embodiment will not be redundantly described hereinafter. It order to clearly distinguish the specific layout pattern, not all of the interconnect layers are shown in FIG. 3, with the interconnect layers which are located at the lower layer and overlapped with the upper metal interconnections being omitted.

Figure 5:
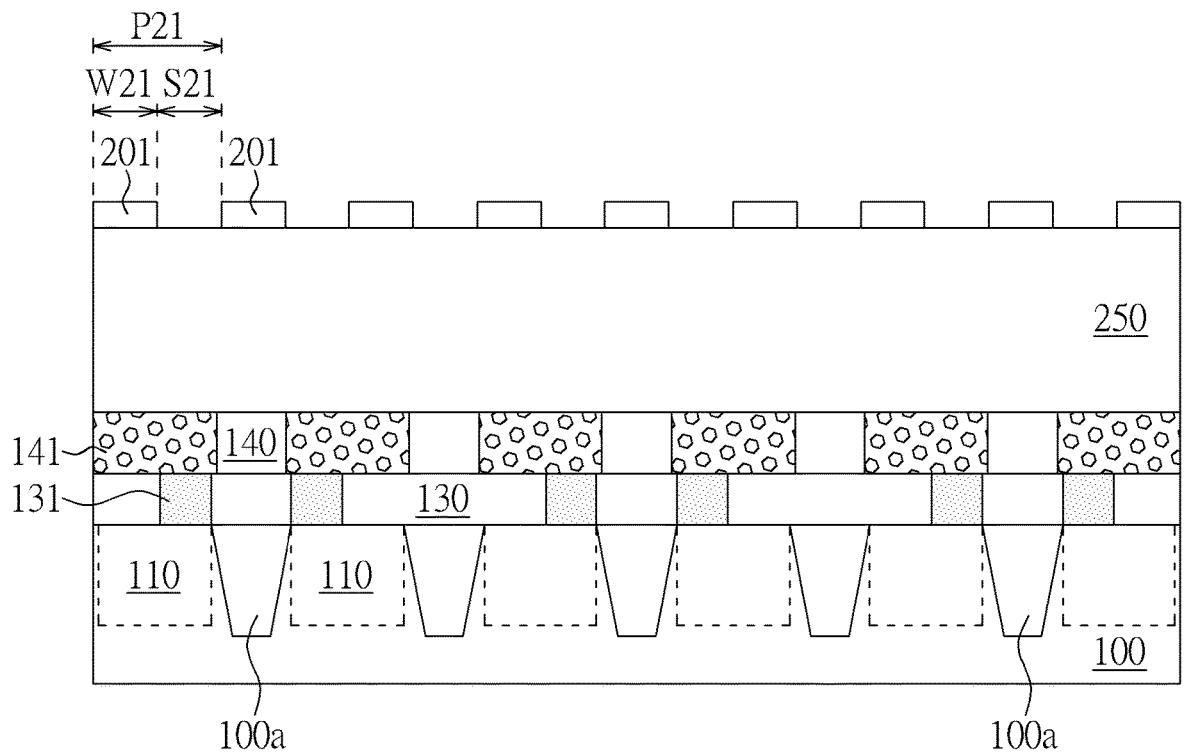
Figure 6:
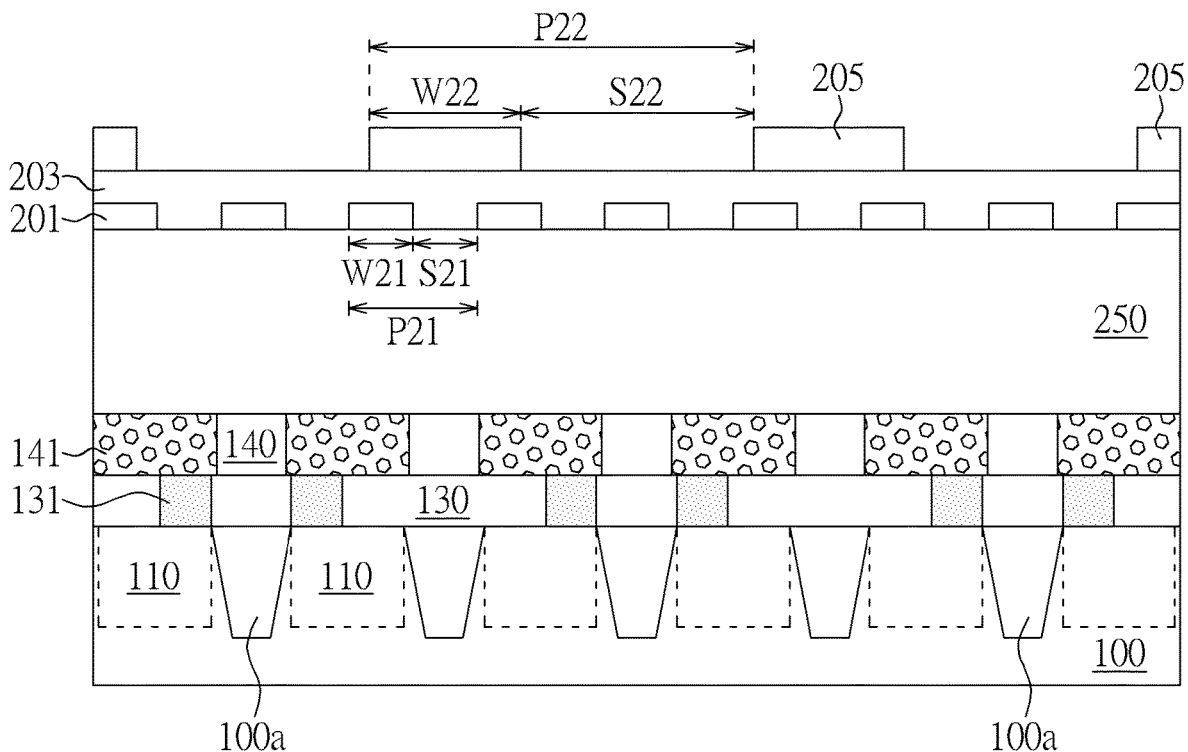
Figure 7:
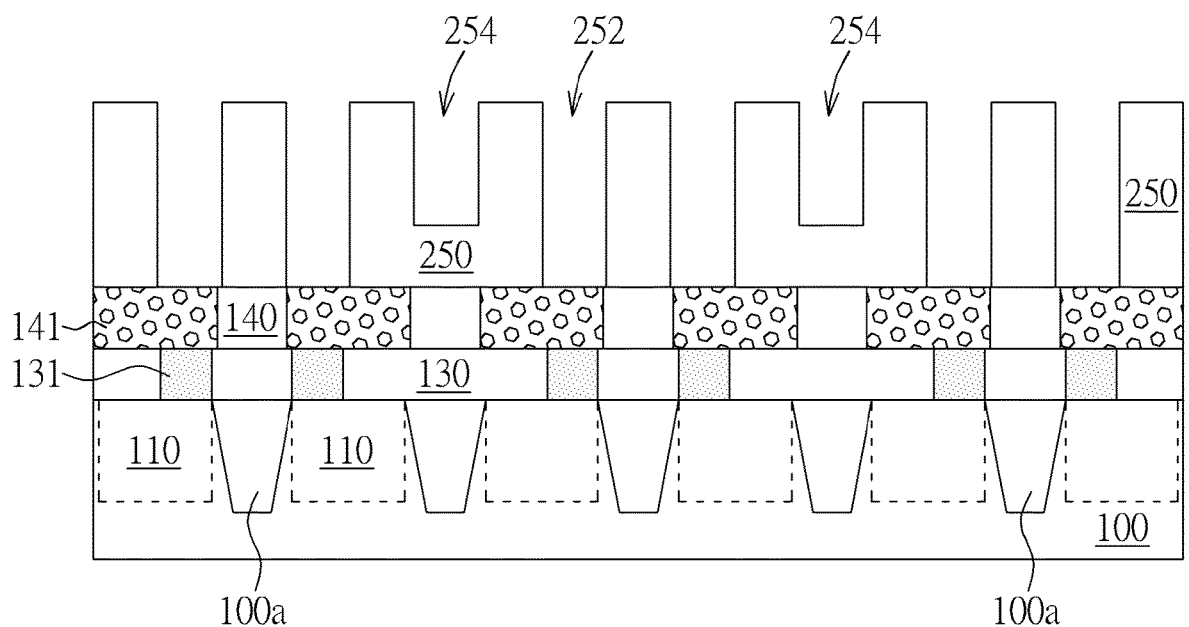
Figure 8:
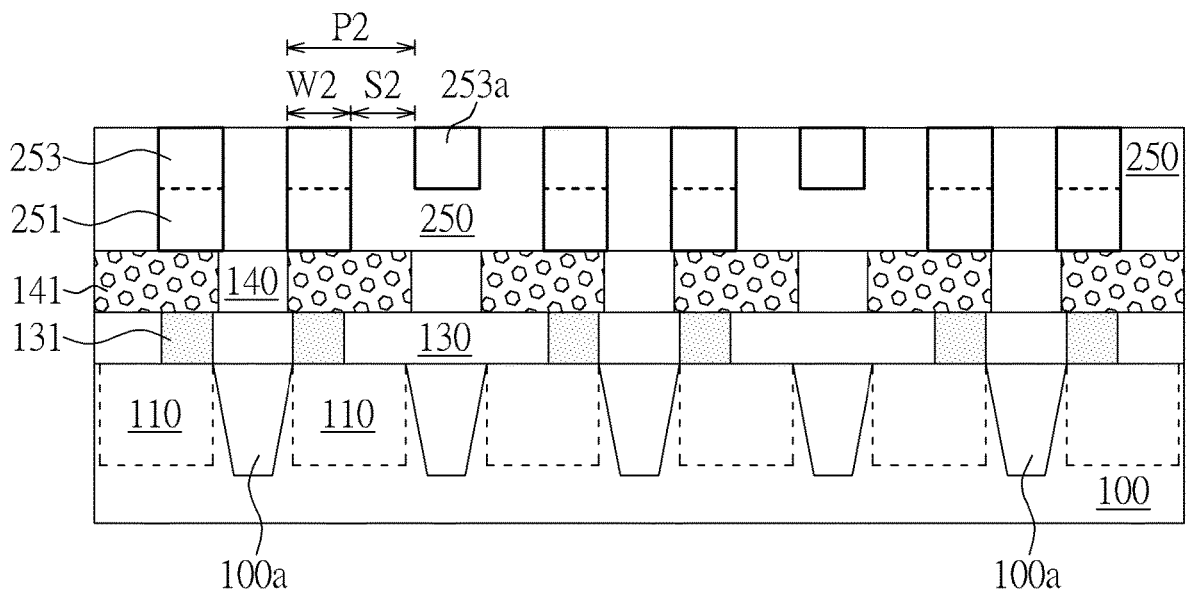

The MRAM region 102 of the substrate 100 further includes a plurality of metal interconnections 251, 253, 253a disposed on the first level metal interconnect layer, to electrically connect the metal interconnections 141, and an inter-metal dielectric layer 250 surrounds the metal interconnections 251, 253, 253a. It is noted that, in the present embodiment, the metal interconnections 251, 253, 253a may be embedded within the inter-metal dielectric layer 250 according to a self-aligned merging process. The self-aligned merging process for example includes the following steps. Firstly, as shown in FIG. 5, forming the inter-metal dielectric layer 250 on the first level metal interconnect layer, with the inter-metal dielectric layer 250 having a flat top surface, and a plurality of mask patterns 201 is formed on the top surface. Preferably, each of the mask patterns 201 has the same width/space (W21/S21), for example with the width and the space both being about 50 nm, and with the pitch P21 of the mask patterns 201 being about 100 nm, but is not limited thereto. Next, as shown in FIG. 6, a blocking layer 203 is formed on the mask patterns 201, to entirely cover all of the mask patterns 201, and then a plurality of mask patterns 205 is formed on the blocking layer 203 through a photolithography process. Preferably, each of the mask patterns 205 has a relative greater width/space (W22/S22), for example with the width W22 being about 110 nm, with the space S22 being about 190 nm, and with the pitch P22 of the mask patterns 205 being enlarged to about 300 nm, but is not limited thereto. In one embodiment, the mask patterns 201 may include a hard mask material which is preferably selected from a group consisting of silicon nitride (SiN), titanium nitride (TiN) or silicon carbon nitride (SiCN). Preferably, the blocking layer 203 includes a bottom anti-reflective coating (BARC) layer or an amorphous carbon (APF) layer, and the mask patterns 205 include a photoresist material, but is not limited thereto. Then, as shown in FIG. 7, an etching process is performed through the coverage of the mask patterns 205, the blocking layer 203, and the mask patterns 201 to etch the inter-metal dielectric layer 250, and the mask patterns 205, the blocking layer 203, and the mask patterns 201 are completely removed after the etching process. During the etching process, the inter-metal dielectric layer 250 where is shielded by the mask patterns 201 cannot be etched, and the inter-metal dielectric layer 250 where is shielded by the mask patterns 205 is etched with a slower etching degree, to form a plurality of opening 254 within the inter-metal dielectric layer 250 without penetrating through the inter-metal dielectric layer 250. On the other hand, the inter-metal dielectric layer 250 where is not shielded by the mask patterns 205 and the mask patterns 201 is completely removed, to form a plurality of openings 252 which penetrate through the inter-metal dielectric layer 250. Following these, as shown in FIG. 8, a deposition process and a planarization process are performed sequentially to form a conductor filled in the openings 252 and the openings 254. In one embodiment, the conductor includes a barrier layer (not shown in the drawings) and a metal layer (not shown in the drawings) which are sequentially deposited in the openings 252, 254, in which the barrier layer may be selected from the group consisting of titanium (Ti), titanium nitride (TiN), tantalum (Ta), and tantalum nitride (TaN), and the metal layer may be selected from the group consisting of tungsten (W), copper (Cu), aluminum (Al), titanium aluminide (TiAl), and cobalt tungsten phosphide (CoWP). The metal layer preferably includes copper, but is not limited thereto.

Accordingly, the conductor which is disposed within the lower portion of the openings 252 and within the upper portion of the openings 252 may respectively form the metal interconnections 251, 253, and the conductor which is disposed within the openings 254 may form the metal interconnections 253a, so that, the metal interconnections 251 may be referred as the first level via conductor layer (V1), and the metal interconnections 253, 253a may be referred as the second level metal interconnect layer (M2). The metal interconnections 253a are configured as the source line (SL), and which may also be electrically connected to the source regions of the MOS transistors through the metal interconnections 141 and the plugs 131. In other words, the metal interconnections 251, 253, 253a are simultaneously formed through the self-aligned merging process in the present embodiment to improve the constrictive process window of the fabrication. Then, the width/space (W2/S2) of the metal interconnections 253, 253a formed thereby may be the same as the width/space (W21/S21) of the mask patterns 201, for example being about 50 nm/50 nm, and the pitch P2 of the metal interconnections 253, 253a may be about 100 nm. In this way, the first level via conductor layer (for example including the metal interconnections 251) and the second level metal interconnect layer (for example including the metal interconnections 253) may be monolithic and to obtain a reduced minimized width/space.

Next, a plurality of metal interconnections 261, a plurality of magnetic memory structures 265, a plurality of metal interconnections 263 and a plurality of metal interconnections 267 are alternately disposed on the inter-metal dielectric layer 250 to electrically connect each of the metal interconnections 253, and at least one inter-metal dielectric layer 260 surrounds the metal interconnections 261, the magnetic memory structures 265, the metal interconnections 263 and the metal interconnections 267. More specifically, the metal interconnections 261 and the metal interconnections 263 are repeatedly arranged on each of the metal interconnections 253 by repeating one metal interconnection 261 followed by one metal interconnection 263, and each of the magnetic memory structures 265 and each of the metal interconnections 267 are respectively disposed on each of the metal interconnections 261 and each of the metal interconnections 263, as shown in FIG. 4. Accordingly, each of the metal interconnections 261, 263 preferably includes a via conductor, to be referred as the second level carrying layer (W2) and the second level via conductor layer (V2) respectively, and each of the metal interconnections 267 preferably includes a trench conductor, to be referred as the third level metal interconnect layer (M3). Furthermore, a plurality of metal interconnections 273, a plurality of metal interconnections 277, a plurality of metal interconnections 271 and a plurality of magnetic memory structures 275 are alternately disposed on the inter-metal dielectric layer 260 to electrically connect to each of the magnetic memory structures 265 and each of the metal interconnections 267 respectively, and an inter-metal dielectric layer 270 surrounds the metal interconnections 273, the metal interconnections 277, the metal interconnections 271 and the magnetic memory structures 275. More specifically, the metal interconnections 273 and the metal interconnections 271 are repeatedly arranged on each of the magnetic memory structures 265 and each of the metal interconnections 267 by repeating one metal interconnection 273 followed by one metal interconnection 271, and each of the metal interconnections 277 and each of the magnetic memory structures 275 are respectively disposed on each of the metal interconnections 273 and each of the metal interconnections 271, as shown in FIG. 4. Accordingly, each of the metal interconnections 273, 271 preferably includes a via conductor, to be referred as the third level via conductor layer (V3) and the third level carrying layer (W3) respectively, and each of the metal interconnections 277 preferably includes a trench conductor, to be referred as the fourth level metal interconnect layer (M4). Then, a plurality of metal interconnections 281 and a plurality of metal interconnections 283 are sequentially disposed on the inter-metal dielectric layer 270 to electrically connect each of the magnetic memory structures 275 and at least one inter-metal dielectric layer 280 surrounds the metal interconnections 281, 283. For example, each of the metal interconnections 281 preferably includes a via conductor, to be referred as the fourth level via conductor layer (V4), and each of the metal interconnections 283 preferably includes a trench conductor, to be referred as the fifth level metal interconnect layer (M5).

In the present embodiment, the magnetic memory structures 265, 275 for example includes magnetic tunnel junction (MTJ) structures, and the magnetic memory structures 265, 275 may be electrically connected the drain regions (namely the doped regions 110) of the MOS transistors through the aforementioned interconnect layers. The magnetic memory structures 265 and the metal interconnections 267 are alternately arranged within the inter-metal dielectric layer 260, and the magnetic memory structures 275 and the metal interconnections 277 are alternately arranged within the inter-metal dielectric layer 270. In other words, the magnetic memory structures 265, 275 are respectively disposed in two different interconnect layers, with the magnetic memory structures 265 and the magnetic memory structures 275 being alternately arranged along a direction (such as the x-direction). Accordingly, the minimized width/the minimized space (W3/S3) of each of the magnetic memory structure 265 and each of the magnetic memory structure 275 may be enlarged to about 50 nm/250 nm, and the pitch P3 of ach of the magnetic memory structure 265 and each of the magnetic memory structure 275 may be about 300 nm, but not limited thereto. Meanwhile, the minimized width/the minimized space of other metal interconnections (for example including the metal interconnections 261, 263, 267, 271, 273,277) which are both disposed in the inter-metal dielectric layer 260 or disposed in the inter-metal dielectric layer 270 may also be enlarged correspondingly, as shown in FIG. 4. Through these arrangements, the fabrications of the magnetic memory structures 265, 275, as well as the fabrications of other metal interconnections disposed within the same interconnect layer as the magnetic memory structures 265, 275 may no longer be constricted by the limited process window. People in the arts should fully understand that the detailed structures of the magnetic memory structures 265, 275 in the present embodiment are substantially the same as those of the magnetic memory structures 173 in the aforementioned embodiment, and will not be redundantly described herein.

In the present embodiment, the fabrications of first level via conductor layer (for example including the metal interconnections 251) and the second level metal interconnect layer (for example including the metal interconnections 253, 253a) of the semiconductor device are integrated, by using the self-aligned merging process to simultaneously form the metal interconnections 251, 253, 253a. Thus, the photolithographic process is avoided in the present embodiment to form the mask patterns with the critical dimension, so that, the problem of constrictive process window caused by reducing the cell height of the bit cell in the aforementioned embodiment may be improved thereby. Also, in the semiconductor device of the present embodiment, the magnetic memory structures 265, 275 are alternately disposed within two different interconnect layers, that is, the minimized width/space of each of the magnetic memory structures 265, 275, and the minimized width/space of other metal interconnections (for example including the metal interconnections 261, 263, 267, 271, 273,277) which are both disposed in the inter-metal dielectric layer 260 or the inter-metal dielectric layer 270 are all enlarged correspondingly. In this way, the fabrications of the magnetic memory structures 265, 275, as well as the fabrications of other metal interconnections disposed within the same interconnect layer as the magnetic memory structures 265, 275 may be no longer constricted by the limited process window, and the semiconductor device may sufficiently reduce the cell height of the bit cell under the permissible process window, thereby improving the element integration and maintaining the performance of the whole device.

Figure 9:
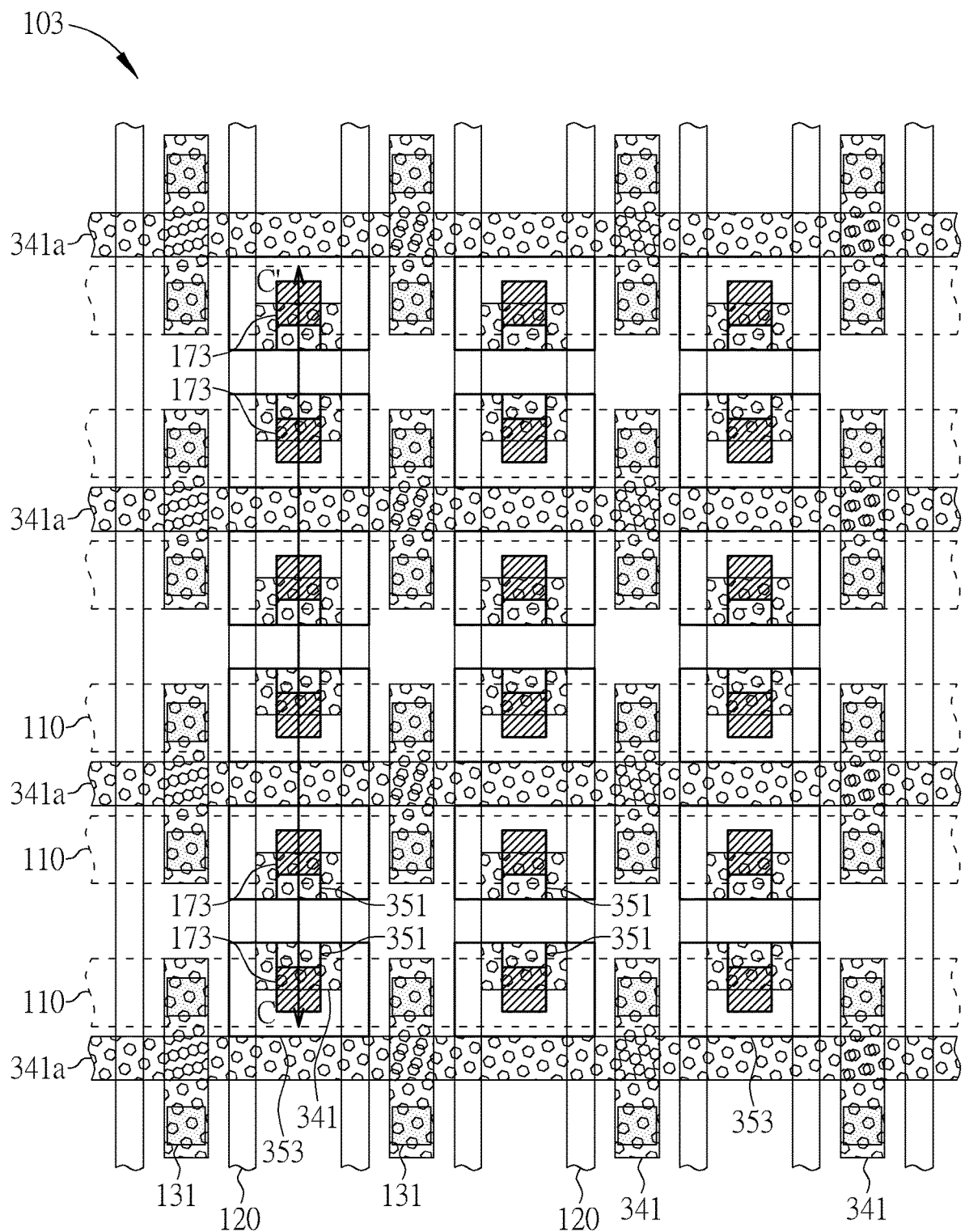
FIG. 9 is a schematic diagram illustrating a top view of a layout of a semiconductor device according to a third preferred embodiment of the present invention.
Figure 10:
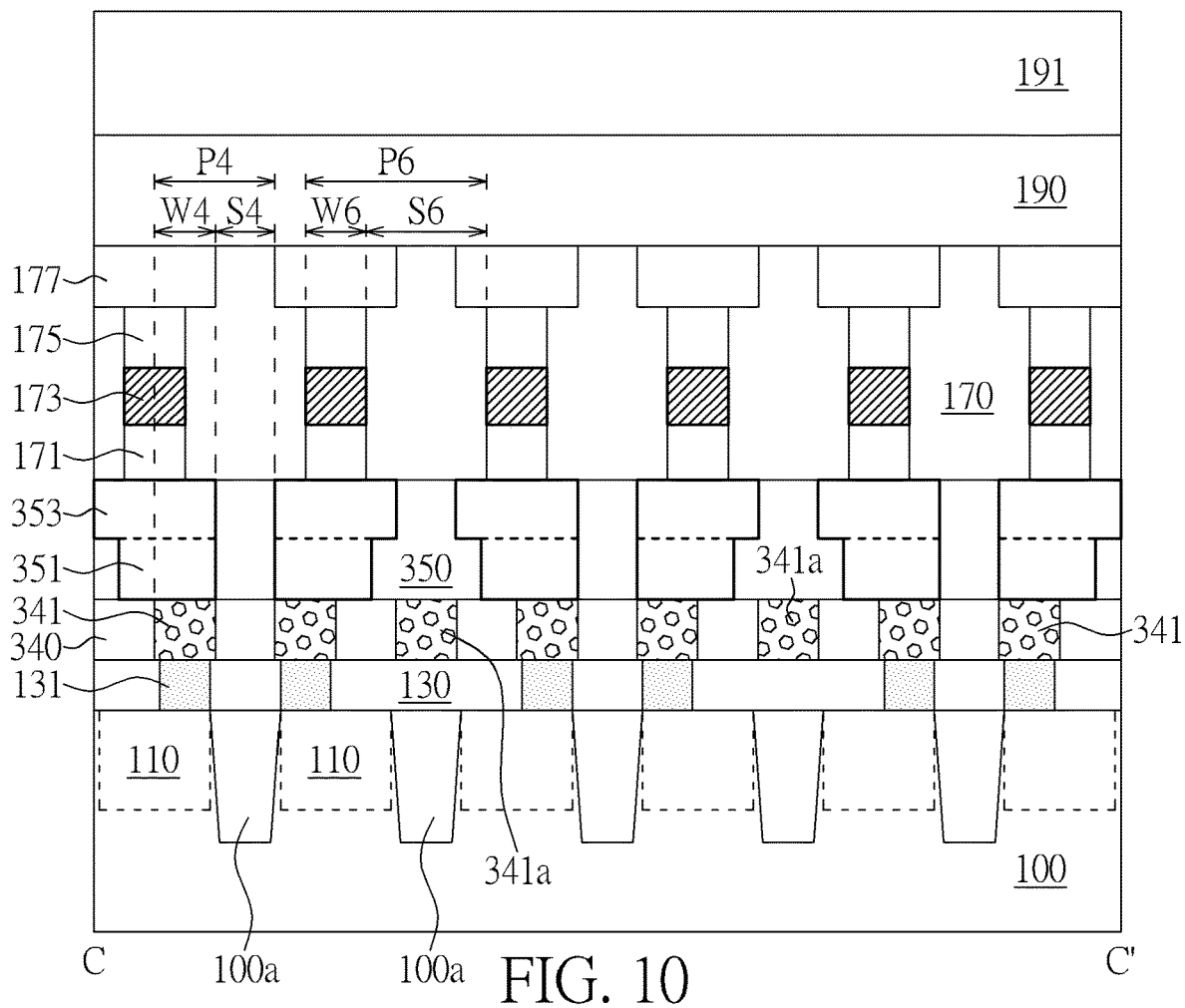
FIG. 10 is a schematic diagram illustrating a cross-sectional view taken along a cross line C-C' of FIG. 9.
Figure 11:
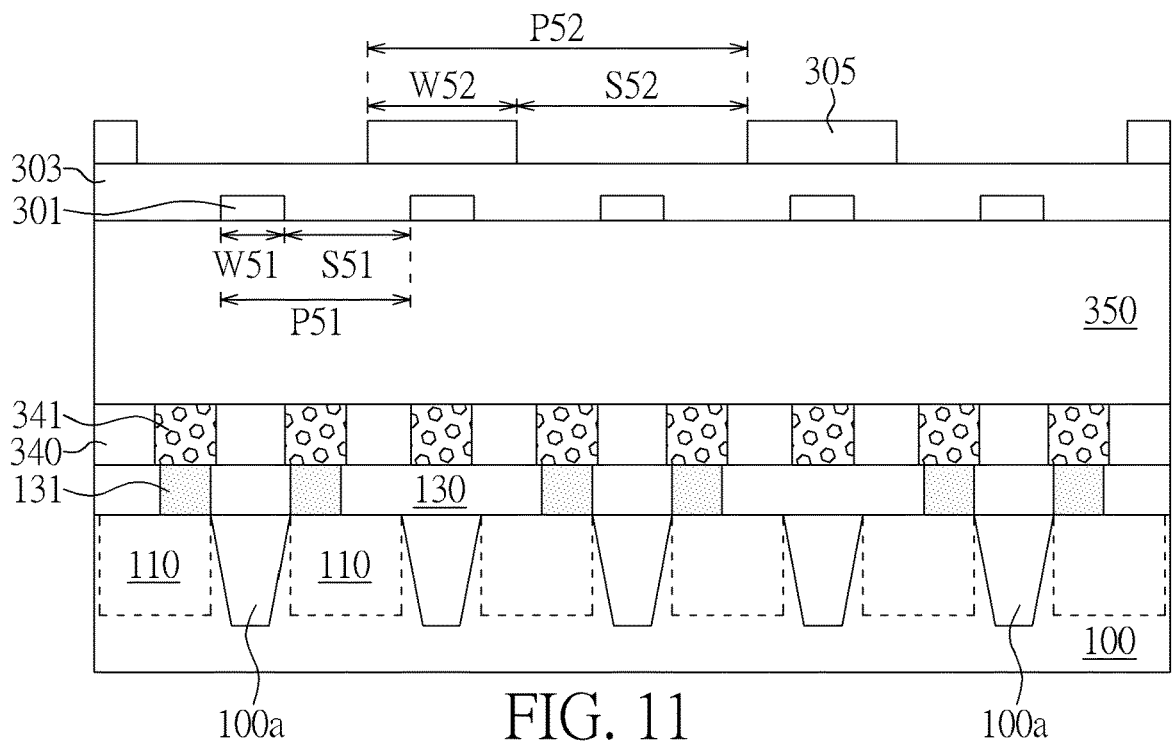
Figure 12:
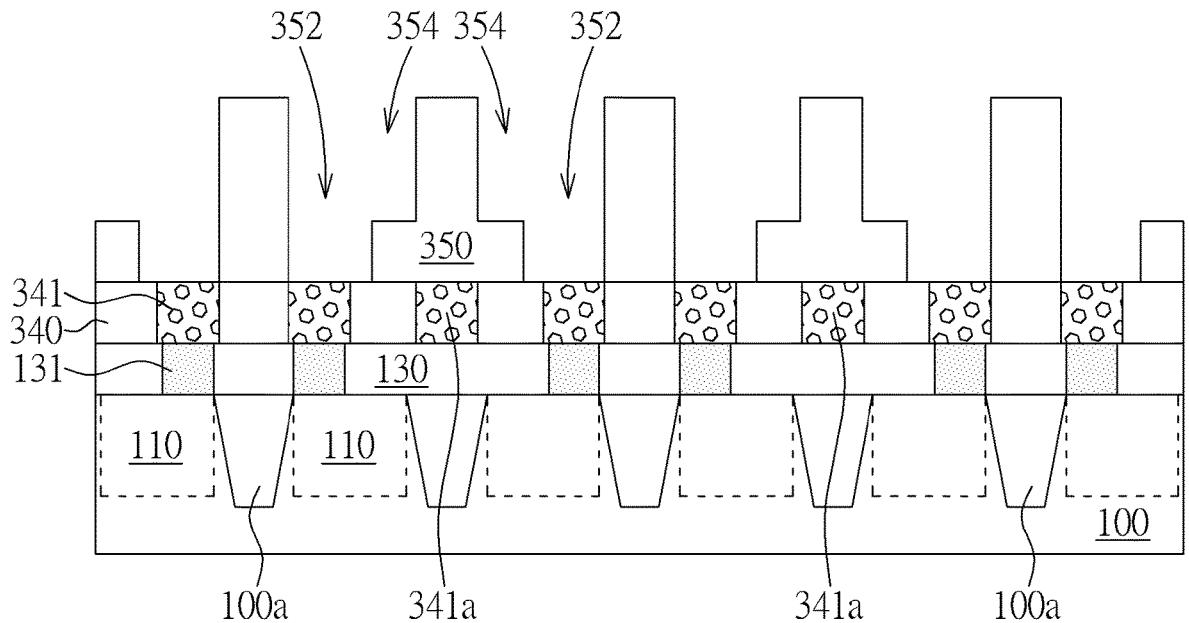
Figure 13:
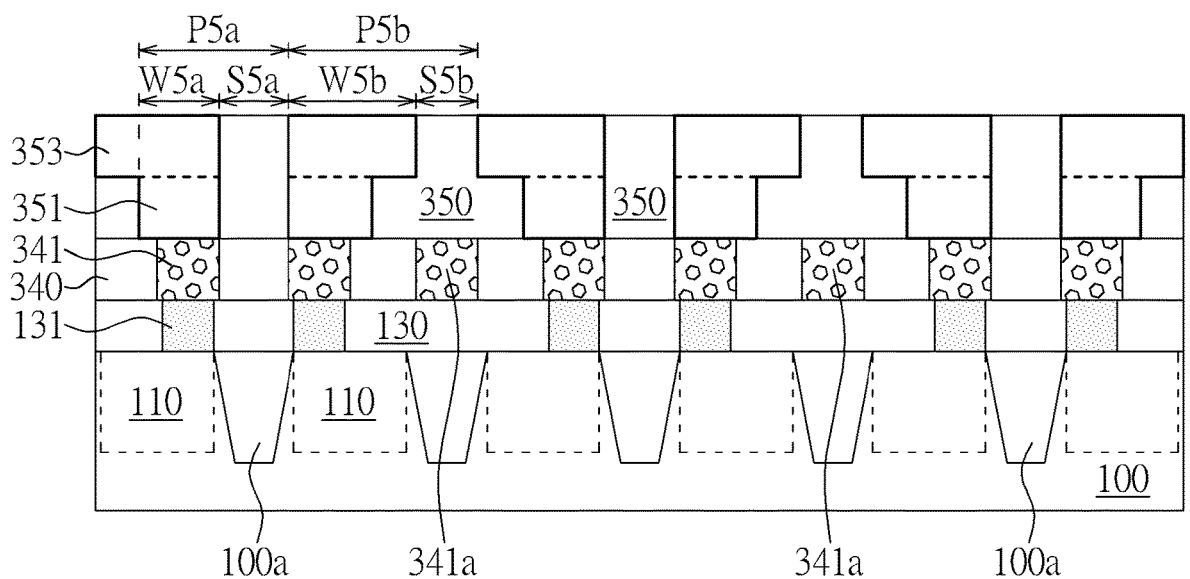

Please refer to FIGS. 9-13, which illustrate a semiconductor device according to the third embodiment of the present invention, wherein FIG. 9 shows a top view of a layout of the semiconductor device, FIG. 10 shows a cross-sectional view of the semiconductor device, and FIGS. 11-13 are schematic diagrams showing the fabricating processes of the semiconductor device respectively. It order to clearly distinguish the specific layout pattern, not all of the interconnect layers are shown in FIG. 9. The semiconductor device is for example a MRAM device, and which also includes the substrate 100, the shallow trench isolations 100a, the doped regions 110, the gate structures 120, the plugs 131 disposed within the interlayer dielectric layer 130, the second level via conductor layer (for example including the metal interconnections 171), the magnetic memory structures 173, the third level via conductor layer (for example including the metal interconnections 175), the fourth level metal interconnect layer (for example including the metal interconnections 177), and the word line 191 disposed within the inter-metal dielectric layer 190. The substrate 100 also includes a MRAM region 103 and the logic region, and other similarities between the aforementioned embodiment and the present embodiment will not be redundantly described hereinafter.

The difference between the aforementioned embodiment and the present embodiment is in that the source line is disposed within the first level metal interconnect layer (M1) in the present embodiment. More specifically, a plurality of metal interconnections 341, 341a is disposed on the interlayer dielectric layer 130 to electrically connect each of the plugs 131, and an inter-metal dielectric layer 340 surrounds the metal interconnections 341, 341a. Preferably, each of the metal interconnections 341, 341a includes a trench conductor, so that the metal interconnections 341 may be referred as the first level metal interconnect layer, and the metal interconnections 341a may be configured as the source line which is electrically connected to the source regions of the MOS transistors respectively through the plugs 131. In the present embodiment, since the source line (namely, the metal interconnections 341a) is disposed within the first level metal interconnect layer, the width/space (W4/S4) of each of the metal interconnections 341, 341a may be constrictive, for example being about 50 nm/50 nm, and the pitch P4 of the metal interconnections 341, 341a is about 100 nm, as shown in FIG. 10.

Next, a plurality of metal interconnections 351, 353 is further disposed on the first level metal interconnect layer to electrically connect the metal interconnections 341 respectively, and an inter-metal dielectric layer 350 surrounds the metal interconnections 351, 353. It is noted that, the metal interconnections 351, 353 may be formed in the inter-metal dielectric layer 350 through a self-aligned merging process, for avoiding the minimized width/the minimized space of the interconnect layer above the first level metal interconnect layer being affected by the width/space (W4/S4) of the metal interconnections 341, 341a. The self-aligned merging process of the present embodiment is substantially the same as that of the aforementioned embodiment, and which includes the following steps. Firstly, as shown in FIG. 11, a plurality of mask patterns 301, a blocking layer 303 entirely covering all of the mask patterns 301, and a plurality of mask patterns 305 are sequentially formed on the inter-metal dielectric layer 350 having a flat top surface.

Preferably, each of the mask patterns 301 has a relative smaller width/space (W51/S51), for example being about 50 nm/100 nm, and with the pitch P51 of the mask patterns 301 being about 150 nm, and each of the mask patterns 305 has a relative greater width/space (W52/S52), for example being about 110 nm/190 nm, and with the pitch P52 of the mask patterns 305 being enlarged to about 300 nm, but is not limited thereto. Besides, the materials of the mask patterns 301, the blocking layer 303 and the mask patterns 305 are substantially the same as that of the mask patterns 201, the blocking layer 203 and the mask patterns 205 of the aforementioned embodiment, and will not be redundantly described herein. Then, as shown in FIG. 12, an etching process is performed through the coverage of the mask patterns 305, the blocking layer 303, and the mask patterns 301 to etch the inter-metal dielectric layer 350, and the mask patterns 305, the blocking layer 303, and the mask patterns 301 are completely removed after the etching process.

During the etching process, the inter-metal dielectric layer 350 where is shielded by the mask patterns 301 cannot be etched, and the inter-metal dielectric layer 350 where is shielded by the mask patterns 305 is etched with a slower etching degree, to form a plurality of opening 354 within the inter-metal dielectric layer 350 without penetrating through the inter-metal dielectric layer 350. On the other hand, the inter-metal dielectric layer 350 where is not shielded by the mask patterns 305 and the mask patterns 301 is completely removed, to form a plurality of openings 352 which penetrate through the inter-metal dielectric layer 350. Following these, as shown in FIG. 13, a deposition process and a planarization process are performed sequentially to form a conductor filled in the openings 352 and the openings 354. The material of the conductor may also be the same as that of the aforementioned embodiment, and will not be redundantly described herein.

Accordingly, the conductor which is disposed within the lower portion of the openings 352 may form the metal interconnections 351, and the conductor which is disposed within the upper portion of the openings 352 and the openings 354 may together form the metal interconnections 353, so that, the metal interconnections 351 may be referred as the first level via conductor layer (V1), and the metal interconnections 353 may be referred as the second level metal interconnect layer (M2). In other words, the metal interconnections 351, 353 are simultaneously formed through the self-aligned merging process in the present embodiment to improve the constrictive process window of the fabrication. Then, the width/space (W5a/S5a) of the metal interconnections 351 formed thereby may be enlarged to about 70 nm/50 nm, the width/space (W5b/S5b) of the metal interconnections 353 formed thereby may be enlarged to about 100 nm/50 nm, and the pitch P5a of the metal interconnections 351 and the pitch P5b of the metal interconnections 353 may be about 120 nm and 150 nm respectively, but not limited thereto. In this way, the first level via conductor layer (for example including the metal interconnections 351) and the second level metal interconnect layer (for example including the metal interconnections 353) may be monolithic, and the minimized width/the minimized space of the metal interconnections 351, 353 may be no longer limited by constrictive process window, so as to obtain an enlarged width/space.

Figure 14:
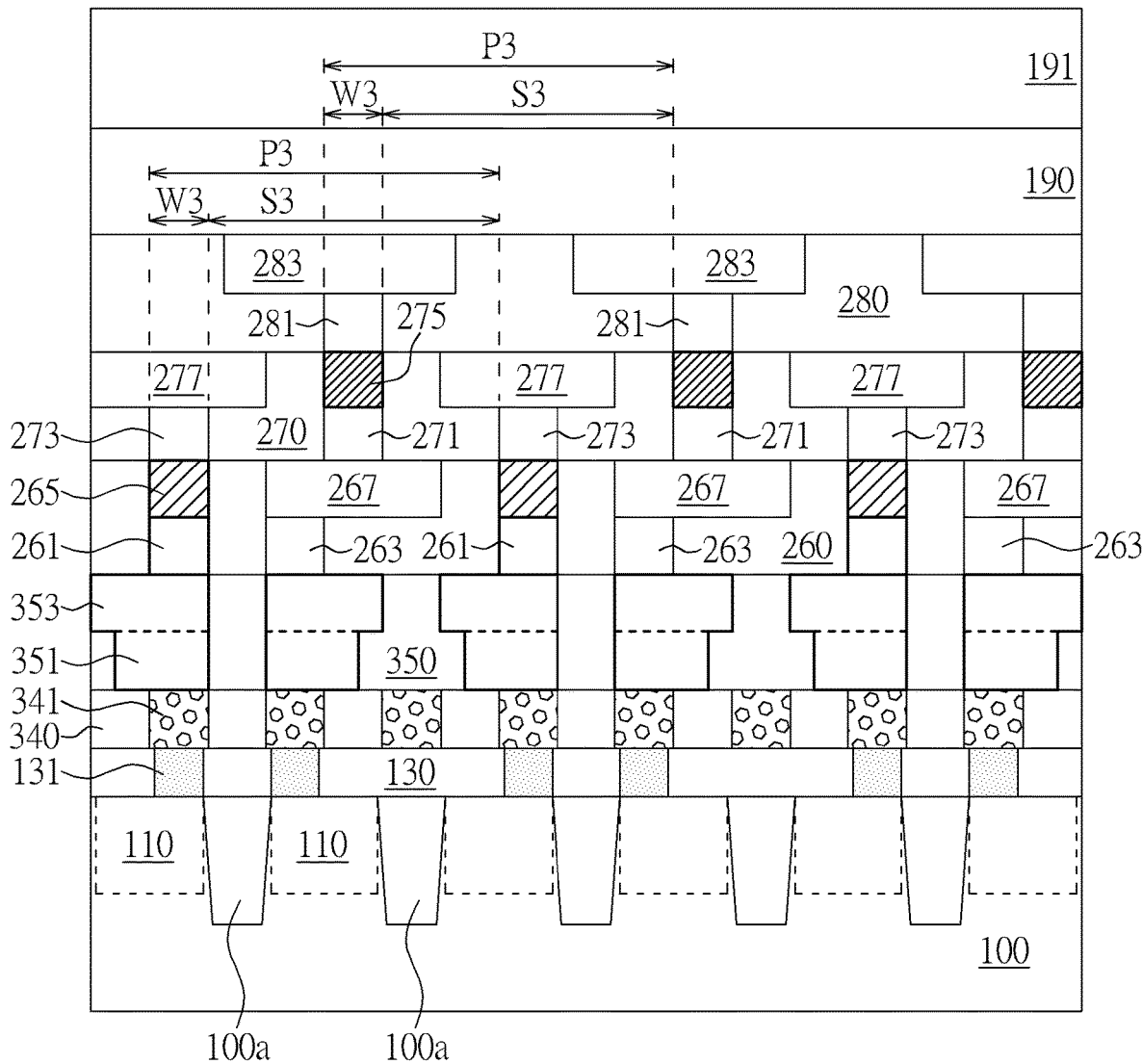
FIG. 14 is a schematic diagram illustrating a top view of a layout of a semiconductor device according to another embodiment of the present invention.

On the other hand, the arrangement of the magnetic memory structures in the present embodiment may be optionally the same as that of the aforementioned first embodiment, for example being disposed within the same interconnect layer. For example, as shown in FIG. 10, the magnetic memory structures 173 are disposed in the inter-metal dielectric layer 170, and which may be electrically connected the drain regions (namely the doped regions 110) of the MOS transistors through the metal interconnections 171, 353, 351, 341 and the plugs 131. Accordingly, the minimized width/the minimized space (W6/S6) of the magnetic memory structures 173 may be about 50 nm/100 nm, and the pitch P6 of the magnetic memory structures 173 may be about 150 nm, but not limited thereto. However, in another embodiment, the arrangement of the magnetic memory structures in the present embodiment may also be the same as that of the aforementioned second embodiment, for example being disposed within the different interconnect layers. For example, as shown in FIG. 14, the magnetic memory structures 265 and the metal interconnections 267 are alternately disposed in the inter-metal dielectric layer 260, and the magnetic memory structures 275 and the metal interconnections 277 are alternately disposed in the inter-metal dielectric layer 270. Accordingly, the magnetic memory structures 265, 275 are disposed within two different interconnect layers respectively, so that, the minimized width/the minimized space (W3/S3) of each of the magnetic memory structures 265, 275 may be enlarged to about 50 nm/250 nm, and the pitch P3 of the magnetic memory structures 265, 275 may be about 300 nm, but not limited thereto. In this way, the fabrications of the magnetic memory structures 265, 275, as well as the fabrications of other metal interconnections disposed within the same interconnect layer as the magnetic memory structures 265, 275 may be carried out under enough process window.

In the semiconductor device of the present embodiment, the source line is disposed in the first level metal interconnect layer, and the first level via conductor layer (for example including the metal interconnections 351) and the second level metal interconnect layer (for example including the metal interconnections 353) are simultaneously formed through the self-aligned merging process, so as to avoid the fabrications of the metal interconnections 351, 353 being affected by the width/space (W4/S4) of the first level metal interconnect layer. Moreover, the magnetic memory structures of the semiconductor device in the present embodiment may be optionally disposed within the same interconnect layer, to further reduce the cell height of the bit cell in the semiconductor device. Otherwise, the magnetic memory structures of the semiconductor device in the present embodiment may also be disposed within different interconnect layers, to gain enough process windows for the fabrications of the magnetic memory structures, as well as other metal interconnections disposed within the same interconnect layers as the magnetic memory structures.

Figure 15:
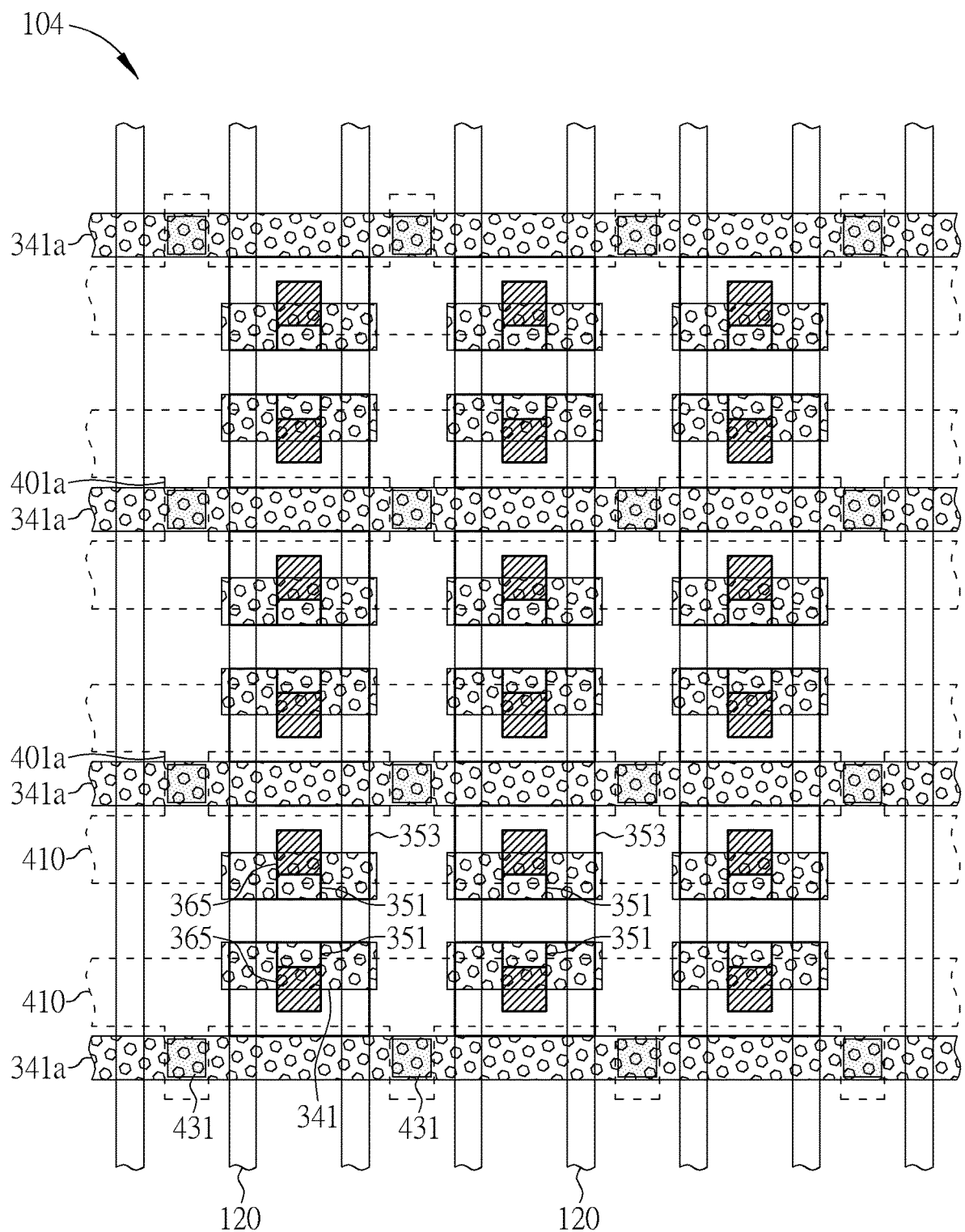
FIG. 15 is a schematic diagram illustrating a top view of a layout of a semiconductor device according to a fourth embodiment of the present invention.

Please refer to FIG. 15, which illustrate a top view of a layout of the semiconductor device according to the fourth embodiment of the present invention, in which, not all of the interconnect layers are shown in FIG. 15, for clearly distinguishing the specific layout pattern. The semiconductor device is for example a MRAM device, and which also includes the substrate 100, the gate structures 120, the first level metal interconnect layer (for example including the metal interconnections 341, 341a), the first level via conductor layer (for example including the metal interconnections 351), the second level metal interconnect layer (for example including the metal interconnections 353), and the magnetic memory structures 173. The substrate 100 also includes a MRAM region 104 and the logic region, and all similarities between the aforementioned embodiment and the present embodiment will not be redundantly described hereinafter.

The difference between the present embodiment and the aforementioned embodiments is in that a plurality of doped regions 410 extended along the same direction (such as the x-direction) is connected with each other by a plurality of connections 410a, thereby to form a H-shaped structure, as shown in FIG. 15. The gate structures 120 also cross each of the doped regions 410 to form a plurality of MOS transistors, and the portions of the doped regions 410 disposed at two sides of the gate structures 120 may be configured as source/drain regions (not shown in the drawings) of each MOS transistors. With these arrangements (the H-shaped doped regions), the disposed positions and the number of the plugs may be reduced accordingly. For example, the plugs which are originally disposed on each of the doped regions 410 may be omitted, and a plurality of plugs 431 may be disposed on each of the connections 410a. In this way, the number of the first level metal interconnect layer (namely the metal interconnections 341, 341a) may be reduced accordingly, with the metal interconnections 341 which are originally disposed on the plugs which are originally disposed on each of the doped regions 410 being omitted for example, as shown in FIG. 15, but not limited thereto.

In the semiconductor device of the present embodiment, the H-shaped doped regions 410, 410a are disposed to sufficiently reduce the number and the disposed positions of the plugs 431, as well as the first level metal interconnect layer (namely the metal interconnections 341, 341a), so as to simplify the complexity of the lower interconnect layers in the semiconductor device. Thus, the island issue of the first level metal interconnect layer may be successfully avoided.

Overall speaking, the fabricating method of the semiconductor device in the present invention integrates the fabrications of two interconnect layers (for example including the first level via conductor layer and the second level metal interconnect layer), to simultaneously form the metal interconnections of the first level via conductor layer and the second level metal interconnect layer through a self-aligned merging process instead of a photolithographic process. Thus, the photolithographic process is avoided in used to form the mask patterns with the critical dimension, so that, the problem of constrictive process window caused by reducing the cell height of the bit cell may be improved thereby. Then, the source ling of the semiconductor device may be optionally disposed in the second level metal interconnect layer or in the first level metal interconnect layer, without leading to the constrictive width/space to the interconnect layers disposed above or below the second level metal interconnect layer or the first level metal interconnect layer. Furthermore, the magnetic memory structures of the semiconductor device may be alternately disposed within two different interconnect layers, so that, the minimized width and/or the minimized space of the magnetic memory structures, as well as the metal interconnections which are also disposed within the two interconnect layers, may be correspondingly enlarged. In this way, the semiconductor device of the present invention may sufficiently reduce the cell height of the bit cell of the semiconductor device under the permissible process window, thereby improving the element integration and maintaining the performance of the whole device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate;
   a first interconnect layer disposed on the substrate, the first interconnect layer comprising a first dielectric layer around a plurality of first magnetic tunneling junction (MTJ) structures and a plurality of first metal interconnections, wherein each of the first metal interconnections has a width greater than a width of each of the first MTJ structures, and the first metal interconnections and the first MTJ structures are alternately arranged in the first dielectric layer; and
   a second interconnect layer disposed on the first interconnect layer, the second interconnect layer comprising a second dielectric layer around a plurality of second MTJ structures, the second MTJ structures and the first MTJ structures being alternately arranged along a direction.

2. The semiconductor device according to claim 1, wherein the first metal interconnections are disposed directly below the second MTJ structures disposed in the second interconnect layer.

3. The semiconductor device according to claim 1, wherein the second interconnect layer further comprises a plurality of second metal interconnections, and the second metal interconnections and the second MTJ structures are alternately arranged in the second dielectric layer.

4. The semiconductor device according to claim 3, wherein the second metal interconnections are disposed directly above the first MTJ structures disposed in the first interconnect layer.

5. The semiconductor device according to claim 1, further comprising:
   a third interconnect layer disposed below the first interconnect layer, between the substrate and the first interconnect layer, the third interconnect layer comprising a third dielectric layer around a plurality of third metal interconnections, wherein a portion of the third metal interconnections is electrically connected to a source region disposed in the substrate.

6. The semiconductor device according to claim 5, further comprising a fourth interconnect layer, the fourth interconnect layer comprising a fourth dielectric layer around a plurality of fourth metal interconnections.

7. The semiconductor device according to claim 6, wherein the fourth interconnect layer is disposed below the third interconnect layer, between the substrate and the third interconnect layer, and a pitch of the fourth metal interconnections is greater than a pitch of the third metal interconnections.

8. The semiconductor device according to claim 7, wherein the third interconnect layer is formed through a self-aligned merging process.

9. The semiconductor device according to claim 6, wherein the fourth interconnect layer is disposed above the third interconnect layer, between the third interconnect layer and the first interconnect layer, and a pitch of the fourth metal interconnections is greater than a pitch of the third metal interconnections.

10. The semiconductor device according to claim 9, wherein the fourth interconnect layer is formed through a self-aligned merging process.

* * * * *